United States Patent
Zhao et al.

(10) Patent No.: US 11,830,709 B2
(45) Date of Patent: *Nov. 28, 2023

(54) BROADBAND PLASMA PROCESSING SYSTEMS AND METHODS

(71) Applicant: Tokyo Electron Limited, Tokyo (JP)

(72) Inventors: Jianping Zhao, Austin, TX (US); Peter Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 166 days.

This patent is subject to a terminal disclaimer.

(21) Appl. No.: 17/498,063

(22) Filed: Oct. 11, 2021

(65) Prior Publication Data

US 2022/0028659 A1 Jan. 27, 2022

Related U.S. Application Data

(62) Division of application No. 16/572,708, filed on Sep. 17, 2019, now Pat. No. 11,170,981.

(51) Int. Cl.
*H01J 37/32* (2006.01)
*H01L 21/66* (2006.01)

(52) U.S. Cl.
CPC .... *H01J 37/3299* (2013.01); *H01J 37/32146* (2013.01); *H01J 37/32183* (2013.01); *H01L 22/14* (2013.01); *H01J 2237/332* (2013.01); *H01J 2237/334* (2013.01)

(58) Field of Classification Search
CPC ........... H01J 37/32183; H01J 37/32174; H01J 37/32091; H01J 37/321; H01J 2237/327
See application file for complete search history.

(56) References Cited

U.S. PATENT DOCUMENTS

| | | |
|---|---|---|
| 5,865,937 A | 2/1999 | Shan et al. |
| 6,043,607 A * | 3/2000 | Roderick .......... H01J 37/32082 315/111.21 |
| 6,541,380 B2 | 4/2003 | Ying et al. |

(Continued)

FOREIGN PATENT DOCUMENTS

KR 20030051692 A 6/2003

OTHER PUBLICATIONS

PCT International Search Report and Written Opinion, International Application No. PCT/US2020/042725, dated Nov. 5, 2020, 14 pages.

(Continued)

*Primary Examiner* — Jaehwan Oh
(74) *Attorney, Agent, or Firm* — Slater Matsil, LLP

(57) ABSTRACT

An exemplary plasma processing system includes a plasma processing chamber, an electrode for powering plasma in the plasma processing chamber, a tunable radio frequency (RF) signal generator configured to output a first signal at a first frequency and a second signal at a second frequency. The second frequency is at least 1.1 times the first frequency. The system includes a broadband power amplifier coupled to the tunable RF signal generator, the first frequency and the second frequency being within an operating frequency range of the broadband power amplifier. The output of the broadband power amplifier is coupled to the electrode. The broadband power amplifier is configured to supply, at the output, first power at the first frequency and second power at the second frequency.

20 Claims, 10 Drawing Sheets

(56) References Cited

U.S. PATENT DOCUMENTS

| | | | |
|---|---|---|---|
| 6,920,312 B1* | 7/2005 | Benjamin | H01J 37/32082 |
| | | | 455/127.5 |
| 7,625,460 B2* | 12/2009 | Howard | H01J 37/32082 |
| | | | 156/345.43 |
| 8,083,961 B2* | 12/2011 | Chen | B05D 3/145 |
| | | | 156/345.47 |
| 8,674,606 B2* | 3/2014 | Carter | H01J 37/32935 |
| | | | 315/111.21 |
| 9,576,811 B2 | 2/2017 | Kanarik et al. | |
| 9,578,731 B2* | 2/2017 | Van Zyl | H01J 37/32935 |
| 9,748,076 B1* | 8/2017 | Choi | H01J 37/32183 |
| 10,304,663 B1* | 5/2019 | Kapoor | H01L 21/67201 |
| 2003/0207583 A1* | 11/2003 | Kuthi | H01J 37/32082 |
| | | | 438/729 |
| 2004/0060660 A1 | 4/2004 | Klimecky et al. | |
| 2004/0242021 A1* | 12/2004 | Kraus | H01L 21/28202 |
| | | | 257/E21.268 |
| 2005/0112891 A1* | 5/2005 | Johnson | H01L 21/30655 |
| | | | 438/691 |
| 2006/0037701 A1* | 2/2006 | Koshiishi | H01L 21/31144 |
| | | | 257/E21.252 |
| 2006/0262889 A1* | 11/2006 | Kalvaitis | H01J 37/32082 |
| | | | 375/355 |
| 2007/0029500 A1* | 2/2007 | Coulombe | H01T 23/00 |
| | | | 250/423 F |
| 2007/0107844 A1 | 5/2007 | Bullock et al. | |
| 2010/0159705 A1 | 6/2010 | Qiu et al. | |
| 2011/0006687 A1* | 1/2011 | Gesche | H01J 37/32082 |
| | | | 315/111.21 |
| 2012/0064726 A1 | 3/2012 | Nozawa et al. | |
| 2015/0011073 A1 | 1/2015 | Lei et al. | |
| 2016/0295677 A1* | 10/2016 | Leeser | H05H 1/46 |
| 2018/0026589 A1* | 1/2018 | Labanc | H03F 3/193 |
| | | | 156/345.48 |
| 2018/0068852 A1* | 3/2018 | Cottle | H01L 21/02118 |
| 2019/0006995 A1* | 1/2019 | Jurkov | H03F 1/565 |

OTHER PUBLICATIONS

PCT International Search Report and Written Opinion, International Application No. PCT/US2020/054402, dated Jul. 5, 2021, 12 pages.

* cited by examiner

BROADBAND PLASMA PROCESSING SYSTEMS AND METHODS

CROSS-REFERENCE TO RELATED APPLICATIONS

This application is a divisional application of U.S. application Ser. No. 16/572,708, filed on Sep. 17, 2019, which application is hereby incorporated by reference herein in its entirety.

TECHNICAL FIELD

The present invention relates generally to plasma systems and methods of operation, and, in particular embodiments, to broadband plasma processing systems and methods.

BACKGROUND

Generally, semiconductor devices, such as integrated circuits (ICs) are fabricated by sequentially depositing and patterning layers of dielectric, conductive, and semiconductor materials over a semiconductor substrate using photolithography and etch to form structures for circuit components and interconnect elements (e.g., transistors, resistors, capacitors, metal lines, contacts, and vias). Some components comprise intricate three-dimensional structures, for example, stack-capacitors in dynamic random access memory (DRAM) cells and fin field-effect transistors (Fin-FETs). Plasma-assisted techniques such as reactive ion etching (RIE), plasma-enhanced chemical vapor deposition (PECVD), plasma-enhanced atomic layer etch and deposition (PEALE and PEALD) have become indispensable in the deposition and etching processes used to form the semiconductor device structures.

The minimum feature sizes are periodically reduced to reduce cost by increasing packing density. Features of a few nanometers can be patterned with innovations such as immersion lithography and multiple patterning. This scaling trend intensifies the technological challenge in forming dense, high aspect ratio nanostructures. In particular, plasma processes provide the capability of forming nanostructures of accurate dimensions along with precisely controlled structural features (e.g., width, depth, edge profile, film thickness, conformality, and anisotropy), often at atomic scale dimensions, uniformly across a wide (e.g., 300 mm) wafer. A variety of plasma processing techniques such as selective deposition and etch, concurrent deposition and etch, pulsed plasma processes, and cyclic processes using alternating deposition and etch cycles have been developed to overcome some of the hurdles in fabricating scaled semiconductor devices. Successful deployment of such techniques in semiconductor manufacturing may need further innovations in plasma equipment design that consider factors such as processing cost, equipment configurability, and equipment cost.

SUMMARY

In accordance with an embodiment of the present invention, a plasma processing system includes a plasma processing chamber, a first electrode for powering a plasma in the plasma processing chamber, a tunable radio frequency (RF) signal generator configured to output a first signal at a first frequency and a second signal at a second frequency. The second frequency is at least 1.1 times the first frequency. The system further includes a broadband power amplifier coupled to the tunable RF signal generator, the first frequency and the second frequency being within an operating frequency range of the broadband power amplifier. The output of the broadband power amplifier is coupled to the first electrode. The broadband power amplifier is configured to supply, at the output, first power at the first frequency and second power at the second frequency.

In accordance with an embodiment of the present invention, a plasma processing system includes a tunable radio frequency (RF) signal generator configured to output a first signal at a first frequency and a second signal at a second frequency. The second frequency is at least 1.1 times the first frequency. The system further includes a broadband power amplifier coupled to the tunable RF signal generator. The first frequency and the second frequency is within an operating frequency range of the broadband power amplifier. The output of the broadband power amplifier is configured to be coupled to an electrode of a plasma processing chamber. The broadband power amplifier is configured to supply, at the output, first power at the first frequency and second power at the second frequency, and provide a feedback to tune the output of the broadband power amplifier to the first frequency or the second frequency.

In accordance with an embodiment of the present invention, a method of operating a plasma processing system comprises generating a radio frequency (RF) signal at tunable RF signal generator; at a broadband power amplifier, amplifying the RF signal to generate an amplified RF signal; supplying the amplified RF signal to power a plasma within a plasma processing chamber; generating a feedback signal by measuring an impedance of the plasma; and adjusting a frequency of the RF signal at the tunable RF signal generator based on the feedback signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

In conventional plasma processing, etching tools and deposition tools have separate processing chambers. However, many process recipes require repeated etching and deposition, which can take a significant amount of processing time as the wafer has to be transferred without breaking vacuum between the different chambers. Combining deposition and etch processes in a single chamber can reduce processing time when such multiple deposition and etching processes are being performed. For example, a single chamber that can do a variety of etch and deposition processes can help to eliminate wafer transfer between different etch and deposition chambers. Different plasma deposition and etch processes (e.g., isotropic and directional deposition/etch) may operate at widely different radio frequencies and hence use very different hardware especially having different RF sources and matching networks. The different RF source also would have separate RF isolation, making the system more complex. Further complexity may occur if, for example, the plasma processing apparatus comprises a first RF electrode connected to an RF signal having a first RF frequency, and a second RF electrode concurrently connected to an RF signal having a second RF frequency. In addition, traditionally, tuning several separate matching networks is very time-consuming. Not only would the tuning be done at each operating frequency but also the tuning is a slow mechanically driven procedure.

Embodiments of the present application disclose a single-chamber design, e.g., for doing both etching and deposition processes. Embodiments of the present application disclose a broadband power amplifier coupled with an electronic feedback control system that helps to quickly toggle between etch and deposition processes. The electronic feedback control system is designed to tune a broadband RF signal generator for ultrafast impedance matching.

Figure 1:
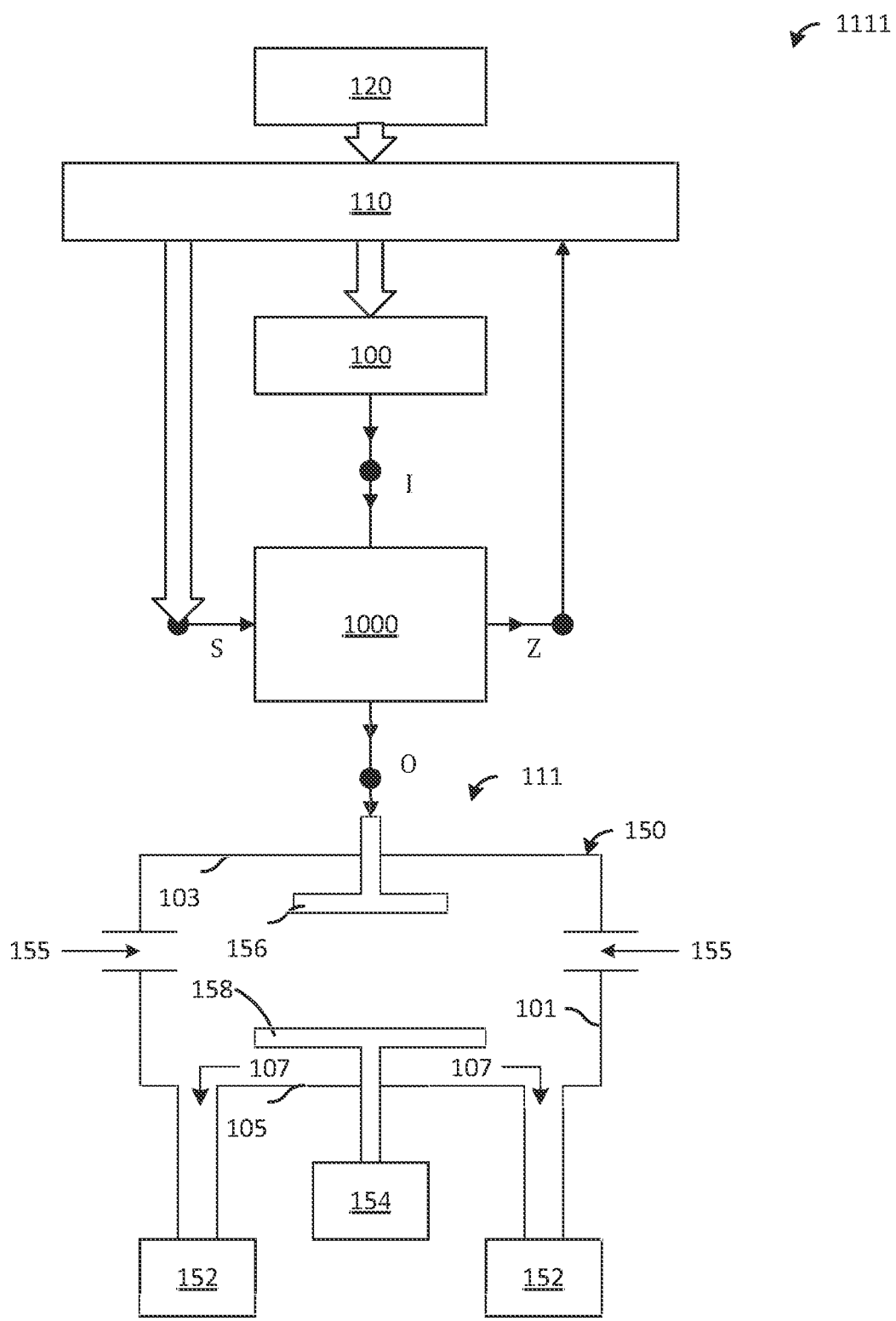
FIG. 1 is a schematic of a broadband plasma system comprising a plasma processing apparatus illustrated in a cross-sectional view in accordance with an embodiment of the invention.

An embodiment of a broadband plasma system utilizing a single channel broadband RF power amplifier is first described using FIG. 1. The single channel broadband RF power amplifier is then described in further detail with reference to FIG. 2. Other example embodiments of broadband plasma systems utilizing the single channel broadband power amplifier are described with reference to FIGS. 3 and 4. A broadband plasma system, wherein the plasma processing chamber may be operated in a dual-frequency mode using a dual channel broadband RF power amplifier is described using FIG. 5. The dual channel broadband RF power amplifier is then described in further detail with reference to FIG. 6. Embodiments illustrating pulsed mode operation using broadband plasma systems comprising an electronically controlled pulse generator are described with reference to FIGS. 7-9. An exemplary method of operating a plasma processing system will then be discussed in FIG. 10.

FIG. 1 illustrates a schematic representation of a broadband plasma processing system 1111 comprising a plasma processing apparatus 111 which includes, for example, a plasma processing chamber 150 illustrated in a cross-sectional view.

In one embodiment, the plasma processing chamber 150 is fitted with a first RF electrode 156 near the top and a substrate holder 158 near the bottom inside the chamber, as illustrated in FIG. 1. The first RF electrode 156 and the substrate holder 158 may be circular in one embodiment. During a plasma processing step, a substrate (e.g., a semiconductor wafer) may be placed on the substrate holder 158. The substrate temperature may be adjusted by a feedback temperature control system 154 using heaters and coolers in the substrate holder 158 to maintain a specified temperature.

A programmable controller 110 may be programmed with a process recipe 120, e.g., stored in a memory of the broadband plasma processing system 1111 as programmable instructions. The process recipe 120 provides the information used to select a center frequency of a narrow band of the broadband tunable RF signal generator 100. Generally, the RF signal generator 100 generates a sinusoidal waveform. In some embodiments, other waveforms may be generated, for example, a sawtooth waveform. Based on the process recipe 120, the programmable controller 110 generates a first control signal that is then transmitted to a tunable RF signal generator 100. During processing, the programmable controller 110 may refine the RF frequency with a small frequency offset within the selected narrow operating frequency band, as explained further below.

During operation, the plasma process is driven by RF power and DC bias supplied to one or more electrodes of the plasma processing chamber. The operation mode of the plasma processing chamber may be altered by a programmable controller with control signals controlling the frequency and magnitude of the RF power and DC bias applied at each electrode.

Based on the first control signal, the tunable RF signal generator 100 generates an RF signal that is provided at an input port I of a broadband RF power amplifier 1000. The broadband RF power amplifier 1000 outputs an amplified RF signal at its output port O, which is then provided to power the plasma, e.g., through the first RF electrode 156. The broadband RF power amplifier 1000 has an operating frequency range between at least 0.1 MHz and 10 GHz. In one exemplary design of the broadband RF power amplifier 1000 an operating frequency range between 400 kHz to 3 GHz is used.

In the example embodiment illustrated in FIG. 1, a direct plasma may be sustained between the substrate and the first RF electrode 156 using RF power coupled to the plasma from the first RF electrode 156 and a grounded substrate. In one embodiment, the grounded substrate comprises connecting the substrate holder 158 to a reference potential, referred to as ground.

The process recipe 120 is also used by the programmable controller 110 to send a second control signal to a signal port S of the broadband RF power amplifier 1000, where the second control signal is used to configure internal switches (e.g., solid-state electronic switches such as thyristors and insulated-gate bipolar transistors (IGBTs)) that select an output matching network in the broadband RF power amplifier 1000. The selected output matching network corresponds to the center frequency of the narrow operating frequency band selected using the initial first control signal, thereby ensuring that the components of the output matching network are aligned with the operating frequency band, as specified by the process recipe 120.

A feedback signal from a feedback port Z of the broadband RF power amplifier 1000 to the programmable controller 110 fine tunes the output frequency at the output port O of the broadband RF power amplifier 1000. The feedback signal is a measure of the efficiency with which RF power is transferred from the broadband RF power amplifier 1000 to the plasma and may be used by the programmable controller no to fine tune the frequency of the RF signal by adjusting the first control signal to the RF signal generator to dynamically tune the RF signal frequency, for example, to maintain maximum power transfer efficiency. The power transfer efficiency is indicated by the fraction of power reflected at the output port O. Accordingly, in one embodiment, the forward power and reflected power is measured and a feedback signal proportional to the reflected power is generated using circuitry internal to the broadband RF power amplifier 1000, as explained in further detail below with reference to FIG. 2.

Still referring to FIG. 1, the plasma processing chamber 150 comprises a tubular sidewall 101, a base 105, and a top cover 103 that collectively substantially enclose the plasma processing chamber 150. The sidewall 101, base 105, and top cover 103 may be made of a conductive material such as stainless steel or aluminum coated with a film such as yttria (e.g., $Y_xO_y$ or $Y_xO_yF_z$), or a film consistent with the process (e.g., carbon or silicon), or as known to a person skilled in the art. Generally, the plasma processing chamber 150 is connected to ground although, in some embodiments, the plasma processing chamber 150 may be floating.

In the example embodiments in this disclosure, carrier and process gases are introduced into the plasma processing chamber 150 by a gas input system comprising inlets 155 in the sidewalls 101. The gas input system may include multiple inlets and may input different gases into the plasma processing chamber 150 at different times, as specified in the process recipe. For example, the design may include additional gas inlets through the top cover 103. A gas exhaust system comprising, for example, outlets 107 in the base 105 and vacuum pumps 152 may be used to remove exhaust gases such as product gases from the plasma processing chamber 150. The vacuum pumps 152 maintain a gas flow between the inlets 155 and outlets 107 of the plasma processing chamber 150.

Various other components of the input and exhaust systems (e.g., flow meters, pressure sensors, and control valves), plasma parameter sensors (e.g., optical emission spectroscopy (OES) sensor, a quadrupole mass spectrometer (QMS), and Langmuir probe), electrostatic grids, electrical connectors, etc. inside the plasma processing chamber 150 are not shown and would be known to a person skilled in the art.

The design of the first RF electrode 156 (e.g., its diameter, thickness, resistance, and self-inductance), the design of the substrate holder (e.g., its diameter, pedestal height, geometry of the built-in heating and cooling elements would be known to a person skilled in the art and therefore not discussed further.

Although components of the plasma processing apparatus 11 illustrated in FIG. 1 have specific geometrical shapes and placements, it is understood that these shapes and placements are for illustrative purposes only; other embodiments may have other shapes and/or placements.

In the broadband plasma processing system 1111 illustrated in FIG. 1, RF power from the broadband RF power amplifier 1000 is transferred to a direct plasma using the first RF electrode 156, disposed within the plasma processing chamber 150.

In further embodiments, the first RF electrode 156 may be placed outside the plasma processing chamber 150 and coupled inductively/capacitively to the plasma within the plasma processing chamber 150. In some other embodiments, the first RF electrode 156 may be replaced with a planar spiral coil disposed over the top cover 103, wherein a portion of the top cover 103 below the planar coil comprises a dielectric window. In yet other embodiments, a helical coil wrapped around the outer surface of the tubular sidewall 101 may be used, wherein the sidewall 101 comprises a dielectric material. In some embodiments, the plasma inside the plasma processing chamber 150 may be sustained by a microwave power source (e.g., a magnetron or solid state microwave generator) using a slotted antenna such as an annular waveguide located outside the tubular sidewall 101 or a slotted antenna disk disposed over the top cover 103. The microwave power from the annular waveguide may be coupled to the plasma using dielectric cover along the annular waveguide and the sidewall 101, and the microwave power from the slotted antenna disk may be coupled to the plasma using a portion of the top cover 103 below the slotted antenna disk as a dielectric window.

Also, in further embodiments, a remote plasma (as opposed to a direct plasma) may be used to process the substrate by using a chamber design wherein the plasma discharge is located remote from the substrate holder.

Figure 2:
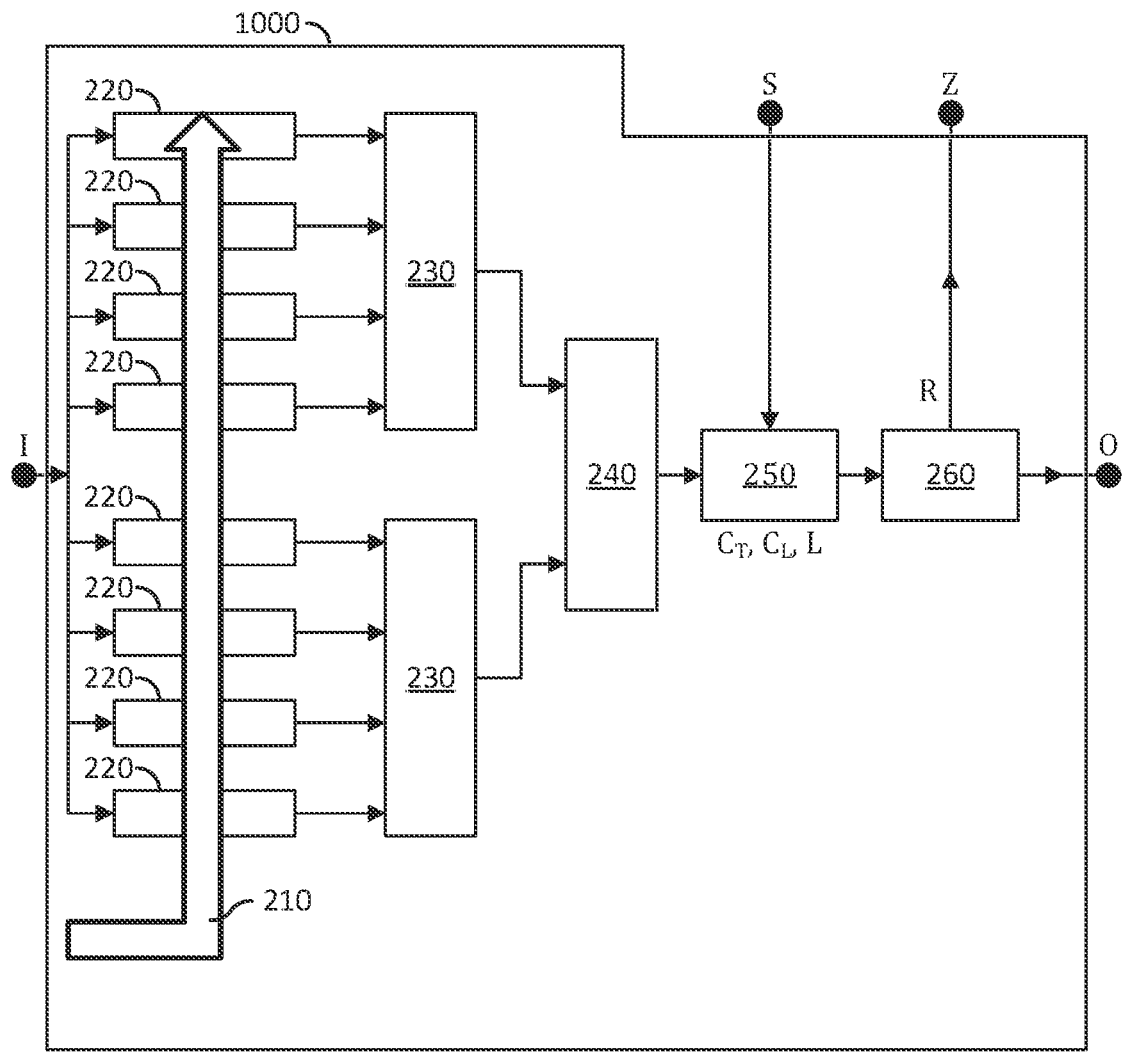
FIG. 2 is a schematic of a single channel broadband RF power amplifier in accordance with an embodiment of the invention.

Next we refer to the schematic view in FIG. 2 to describe a construct of the single channel broadband RF power amplifier 1000 having four ports: input port I, output port O, signal port S, and feedback port Z, connected to various other circuits of the broadband plasma system as described above with reference to FIG. 1.

As illustrated in FIG. 2, an input signal at some RF frequency applied to input port I is distributed to an array of power amplifiers 220 powered by DC power supplies 210 indicated by the wide arrow drawn across the amplifier array. Collectively, the array of power amplifiers 220 span a wide range of frequency, although any one of the eight power amplifiers 220 in FIG. 2 may be designed to amplify an RF signal within a relatively narrow frequency band. The power amplifiers 220 may comprise laterally-diffused or extended-drain metal-oxide-semiconductor (LDMOS or EDMOS) silicon transistors, or silicon carbide, or gallium nitride based power devices, or the like, depending on power and frequency.

The outputs from the power amplifiers 220 are combined by a set of combiners in one or more stages, for example, the set of two four-input intermediate combiners 230 and one two-input final combiner 240. Collectively, the array of power amplifiers 220, the four-input intermediate combiners 230 and the final combiner 240 function as a broadband power amplifier unit. As is known to a person skilled in the art, the number of amplifiers and combiners may be chosen based on the individual design requirements of the plasma system.

The output of the final combiner 240 is connected to an electronically configurable network of passive elements, referred to as an output matching network, comprising, for example, a tuning capacitor ($C_T$), a load capacitor ($C_L$), and an optional inductor (L). As known to a person skilled in the art, the impedance of an output matching network comprising capacitors (or inductors) is frequency-dependent. Since the broadband plasma system 1111 may be operating the plasma processing apparatus 11 at widely spaced frequency bands, the capacitance (or inductance) value used has to be aligned with the operating frequency specified in the process recipe 120. Accordingly, whenever the process recipe 120 specifies a different operating RF frequency, the programmable controller 110 may generate a new second control signal for the broadband RF power amplifier 1000 to select one or more components from multiple passive components in an output matching network circuit 250.

In one embodiment, the output matching network circuit 250 uses the second control signal received at the signal port S of the broadband RF power amplifier 1000 to configure matching network circuit 250 using built-in solid-state electronic switches such as thyristors and IGBTs to select, for example, one of several tuning capacitors and connect it in series and/or in parallel to a combination of a fixed inductor and a fixed load capacitor. The three passive elements then form an output matching network using a specific combination of $C_T$, $C_L$, and L aligned with the respective operating frequency band.

Although the passive component (e.g., a tuning capacitor) corresponding to the RF frequency specified in the process recipe 120 may be selected, it may still not be sufficient for adequate impedance matching between the broadband RF power amplifier 1000 and the load impedance connected at the output port O, such as the impedance of the plasma processing apparatus 111 in FIG. 1. The impedance of the output matching network may have to be adjusted further because the load impedance comprises not only the impedance of the hardware (e.g., the RF electrode and cables) but also the impedance of the plasma that may be variable, even during the same process step. Sub-optimal impedance matching degrades the power transfer efficiency and is indicated by a larger reflected power from the output port O normalized to the forward power dissipated in the load.

Embodiments in this disclosure may rapidly minimize the normalized reflected power by continually adjusting the impedance of the selected output matching network using a feedback control system that continually fine-tunes the frequency of RF signal with continual adjustments made to the first control signal transmitted to the RF signal generator 100. In various embodiments, output power from the array of power amplifiers 220 may also be changed while fine tuning the frequency for minimal reflected power. Several methods of generating an appropriate feedback signal that may be used to optimize the impedance matching are described further below.

Still referring to FIG. 2, in one embodiment, the reflected power and forward power are measured by a power analyzer circuit 260. The output of the output matching network circuit 250 is input to an incident port of the power analyzer circuit 260. The incident power mostly passes through the power analyzer circuit 260 to the output port O of the broadband RF power amplifier 1000.

In one or more embodiments, the reflected power and forward power may be measured by using a broadband RF V-I sensor that independently senses the magnitudes and phases of the voltage (V) and current (I) of the RF signal that exits the power analyzer circuit 260. Circuitry internal to the power analyzer circuit 260 may analyze the measured V and I to generate a feedback signal proportional to the normalized reflected power (indicated as R in FIG. 2) at the feedback port Z.

In some embodiments, a V-I sensor is used to measure the reflected power and forward power, as described above, while in some other embodiments, a directional coupler may be used to directly detect the forward and reflected power. The output of the output matching network circuit 250 may be input to an incident port of the directional coupler placed within the power analyzer circuit 260. The through port of the directional coupler may be connected to the output port O. A known small fraction of the forward RF signal appears at the coupled port and the reflected RF signal appears at the isolated port of the directional coupler. Other circuitry in the power analyzer circuit 260 may generate the feedback signal (R) proportional to the normalized reflected power at the feedback port Z.

The broadband plasma processing system 1111 described in this disclosure comprises the broadband RF power amplifier 1000 with several built-in circuits, such as the matching network circuit 250 and the power analyzer circuit 260. However, it is understood that, in some other embodiment, components that are integrated in the broadband RF power amplifier 1000 may be relocated outside, and components outside the broadband RF power amplifier 1000 may be integrated without altering the functionality of the broadband plasma processing system 1111. For example, the matching network circuit 250 or the power analyzer circuit 260 may be integrated in a separate component from the broadband RF power amplifier 1000. Similarly, in another illustration, the RF signal generator 100 may be integrated within the broadband RF power amplifier 1000.

As shown in FIG. 1, the feedback signal from the feedback port Z is sent to the programmable controller 11o. The programmable controller 110 continuously processes the feedback signal from the feedback port Z and refines the first control signal to adjust the frequency of the tunable RF signal generator 100 within a narrow band centered at the frequency specified in the process recipe. This feedback method of continually fine-tuning the RF frequency till the impedance is matched for maximum power transfer efficiency from the broadband RF power amplifier 1000 to the first RF electrode 156 and the plasma is referred to as frequency sweep tuning with center frequency offset, and may be used for ultrafast impedance matching.

Figure 3:
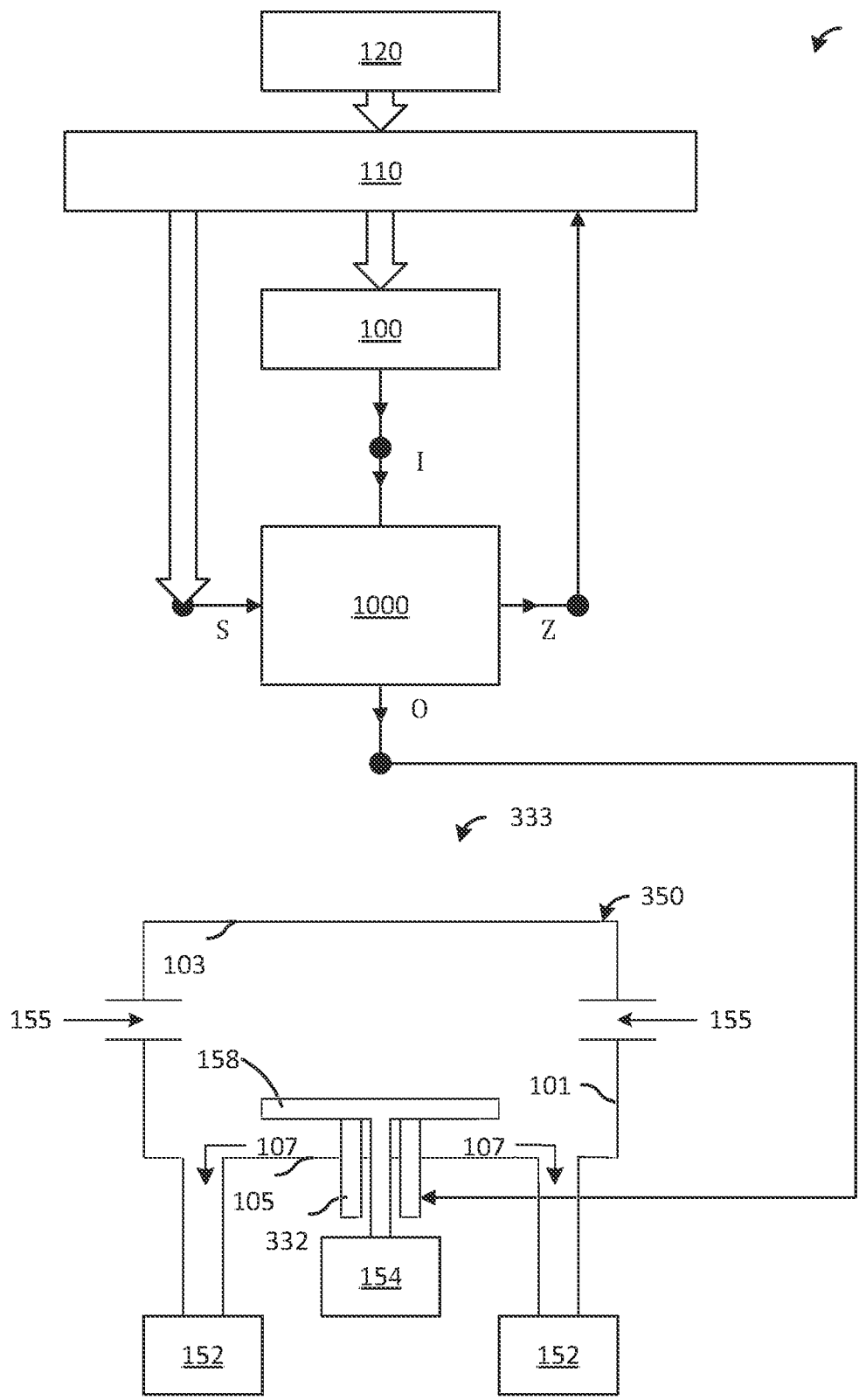
FIG. 3 is a schematic of a broadband plasma system comprising a plasma processing apparatus illustrated in a cross-sectional view in accordance with an alternative embodiment of the invention.

FIG. 3 shows a schematic representation of a broadband plasma processing system 3333, wherein the RF signal power for sustaining the plasma is generated and controlled using the same method as described for the broadband plasma processing system 1111 illustrated schematically in FIG. 1. However, in this embodiment, the plasma processing apparatus 333 comprises a plasma processing chamber 350, where the substrate holder 158 is used as a first RF electrode. In particular, there is no separate first RF electrode 156 (or top electrode), as in the embodiment illustrated in FIG. 1. As illustrated in FIG. 3, instead of connecting the substrate holder 158 to ground, the substrate holder 158 of the plasma processing apparatus 333 is connected to the output port O of the broadband RF power amplifier 1000, and the RF power is used to sustain a direct plasma in close proximity to the substrate (not shown). The broadband RF power amplifier 1000 of FIG. 3 may be similar to the broadband RF power amplifier 1000 described using FIG. 2.

In various embodiments, the broadband plasma processing systems 1111 and 3333 may operate the respective plasma processing apparatus 111/333 between a first frequency band and a second frequency band sequentially or alternately. In a sequential operation mode, the substrate undergoes at least two sequential plasma process steps before exiting the plasma processing chamber 150/350. A first plasma process step (e.g., a PECVD process) is first performed using RF power at the first frequency, and is followed by a second plasma process step (e.g., an RIE process step) performed using RF power at the second frequency.

In the alternating operation mode, a cyclic plasma process step (e.g., a Bosch etch process) may be performed by alternating between plasma etching and plasma deposition using, for example, the first frequency during the plasma deposition and the second frequency during the plasma etch.

In order to provide RF power at multiple frequencies to the first RF electrode 156 (for the plasma processing apparatus 111) or the substrate holder 158 (for the plasma processing apparatus 333), the process recipe 120 may include explicit instructions for the programmable controller 110 to configure the output matching network of the broadband RF power amplifier 1000 and the tunable RF signal generator 100 to switch between two frequency bands synchronously by using the pair of first and second control signals, as discussed above. Alternatively, the programmable controller 110 may by itself determine the different configurations for the output matching network circuit 250 and/or input for the tunable RF signal generator 100, based on the operating frequency defined by the process recipe 120.

Although the sequential operation mode and the alternating operation mode are described herein with reference to a first frequency and a second frequency, it is understood that the embodiments disclosed in this application can be used to accommodate more than two frequencies.

Figure 4:
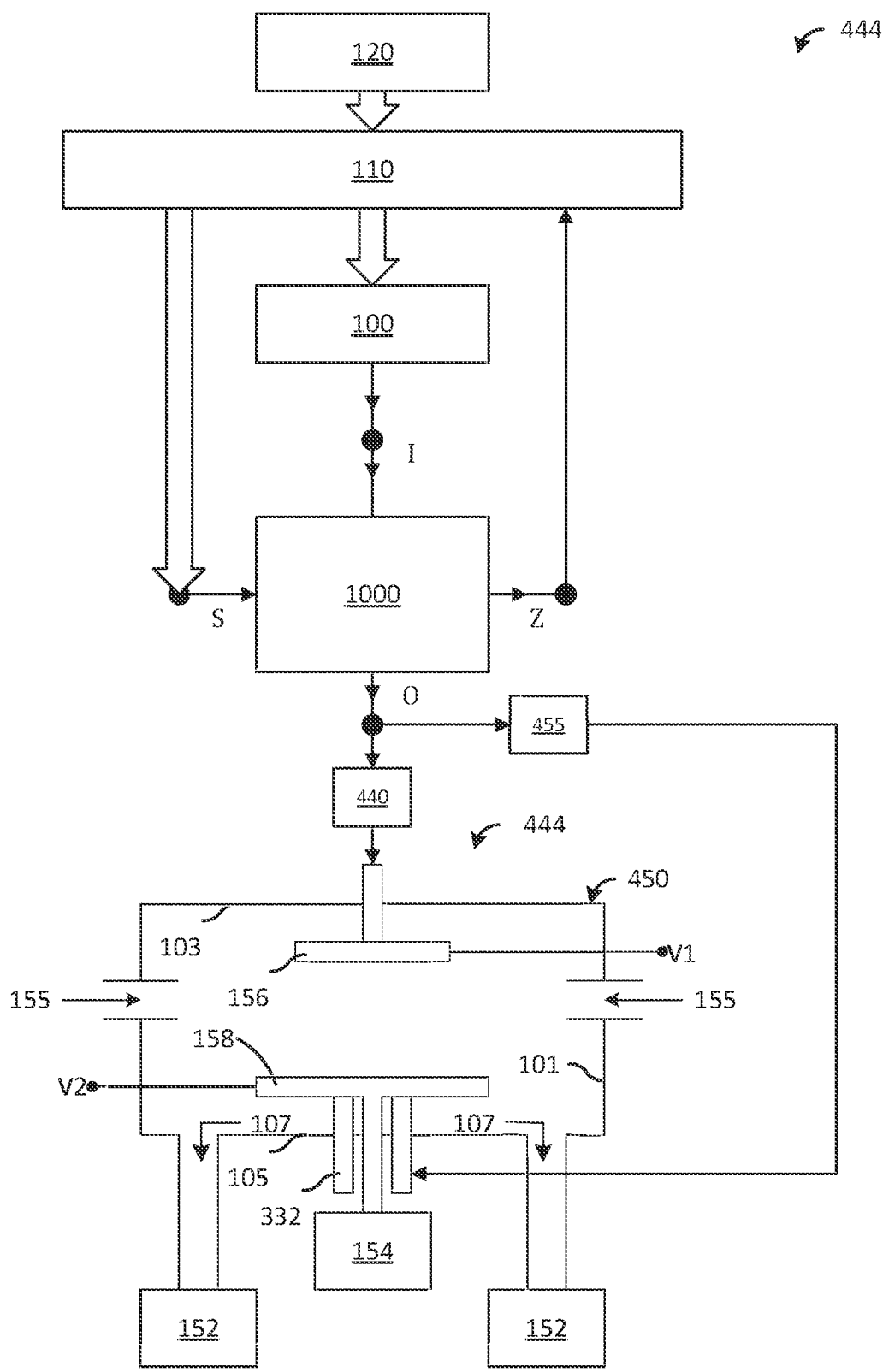
FIG. 4 is a schematic of a broadband plasma system comprising a plasma processing apparatus illustrated in a cross-sectional view in accordance with an alternative embodiment of the invention.

FIG. 4 illustrates a broadband plasma processing system 4444, wherein the designs of the plasma processing apparatus 11 and 333, described above with reference to FIGS. 1 through 3, are combined to enhance the flexibility in adjusting the properties of plasma discharge in the plasma processing chamber 450. The RF signal power for sustaining the plasma is generated and controlled using the same method as described for the broadband plasma processing systems 1111 and 3333. The broadband RF power amplifier 1000 of FIG. 4 may be similar to the broadband RF power amplifier 1000 described using FIG. 2.

As illustrated in FIG. 4, the plasma processing apparatus 444 uses two RF electrodes: a first RF electrode 156 located near the top of the plasma processing chamber 450 and a second RF electrode which is the substrate holder 158 near the base 105. Both the first RF electrode 156 and the substrate holder 158 receive power from the output port O of the broadband RF power amplifier 1000.

However, in this embodiment, the signal to the first RF electrode 156 is filtered by a first bandpass filter 440 that blocks RF power outside a first frequency band and the signal to the substrate holder 158 is filtered by a second bandpass filter 455 that blocks RF power outside a second frequency band. By inserting the first and second bandpass filters 440 and 455 in the respective signal paths, the broadband plasma processing system 4444 provides a method to perform sequential and alternating plasma processes on a semiconductor substrate. Thus, the first RF electrode 156 may be powered at the same time as the substrate holder 158 or they may be alternatively powered. However, the first bandpass filter 440 ensures that the first RF electrode 156 is powered at the first frequency band while the substrate holder 158 is powered at the second frequency band.

The broadband plasma processing system 4444 may additionally include two independent DC power supplies, one used to superimpose a first DC bias V1 on the first RF electrode 156 and the other used to superimpose a second DC bias V2 on the substrate holder 158 (the second RF electrode). The first and second DC bias values may be controlled by the programmable controller 110 or disabled, in accordance with the process recipe 120 of the broadband plasma processing system 4444.

Figure 5:
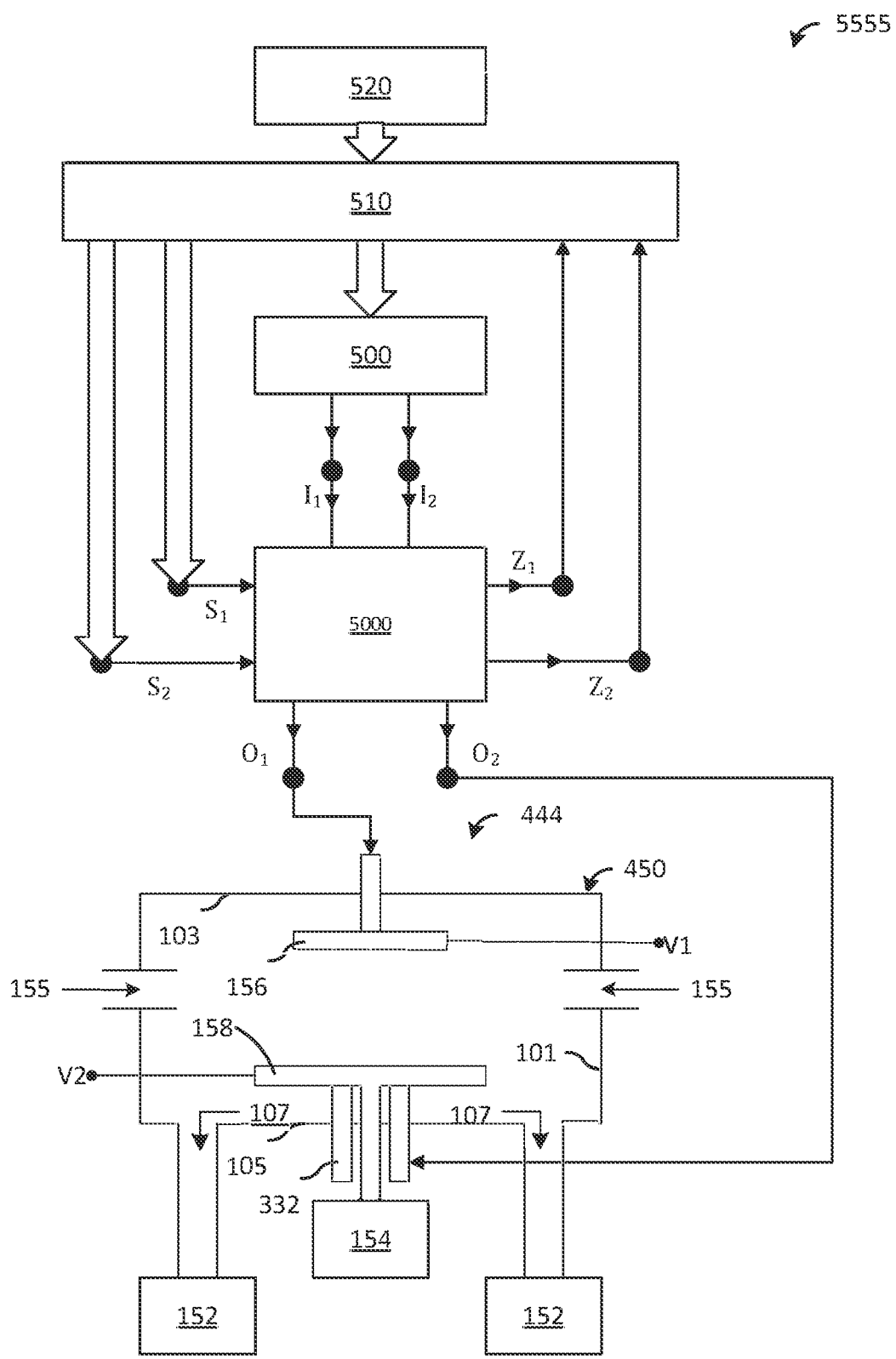
FIG. 5 is a schematic of a broadband plasma system comprising a plasma processing apparatus illustrated in a cross-sectional view in accordance with an alternative embodiment of the invention.

FIG. 5 illustrates an example of a dual-frequency broadband plasma processing system 5555 comprising the plasma processing apparatus 444 having two RF electrodes (described with reference to FIG. 4). The two RF electrodes may be simultaneously powered by independent RF signals at two discrete frequencies during dual-frequency operation.

As mentioned above, it is understood that the choice of dual-frequency in this embodiment and prior embodiments is for illustration only; the various plasma systems discussed in this application such as the dual-frequency broadband plasma processing system 5555 can be used to accommodate more than two frequencies.

As illustrated in FIG. 5, RF power from two isolated output ports $O_1$ and $O_2$ of a dual channel broadband RF power amplifier 5000 of the dual-frequency broadband plasma processing system 5555 may be used to independently power the first RF electrode 156 and the substrate holder 158 (the second RF electrode). Two independent RF signals, generated by a tunable dual channel RF signal generator 500, drives input ports $I_1$ and $I_2$ of the dual channel broadband RF power amplifier 5000, as illustrated in FIG. 5.

The frequency bands of the two RF input signals are synchronously controlled with a first control signal sent to the tunable dual channel RF signal generator 500 from a dual channel programmable controller 510. The dual channel programmable controller 510 also sends two control signals to the signal ports $S_1$ and $S_2$ of the dual channel broadband RF power amplifier 5000 to synchronize the frequency bands to the respective output matching networks in the dual channel broadband RF power amplifier 5000. The control signals used to select the frequency bands and configure the output matching networks synchronously are in accordance with a process recipe 520 of the dual-frequency broadband plasma processing system 5555.

Feedback signals from two impedance ports $Z_1$ and $Z_2$ of the dual channel broadband RF power amplifier 5000 are used to fine tune the frequencies. As in the prior embodiments, the feedback signals may be used to adjust the impedance of the output matching networks for the most efficient power transfer during plasma processing and the input to the dual channel RF signal generator 500.

As in the prior embodiment, the dual-frequency broadband plasma processing system 5555 may additionally include two independent DC power supplies for applying a first DC bias V1 and a second DV bias V2 to the first RF electrode 156 and the substrate holder 158. The applied DC bias voltages may be controlled by the dual channel programmable controller 510, as described above for the broadband plasma processing system 4444.

Figure 6:
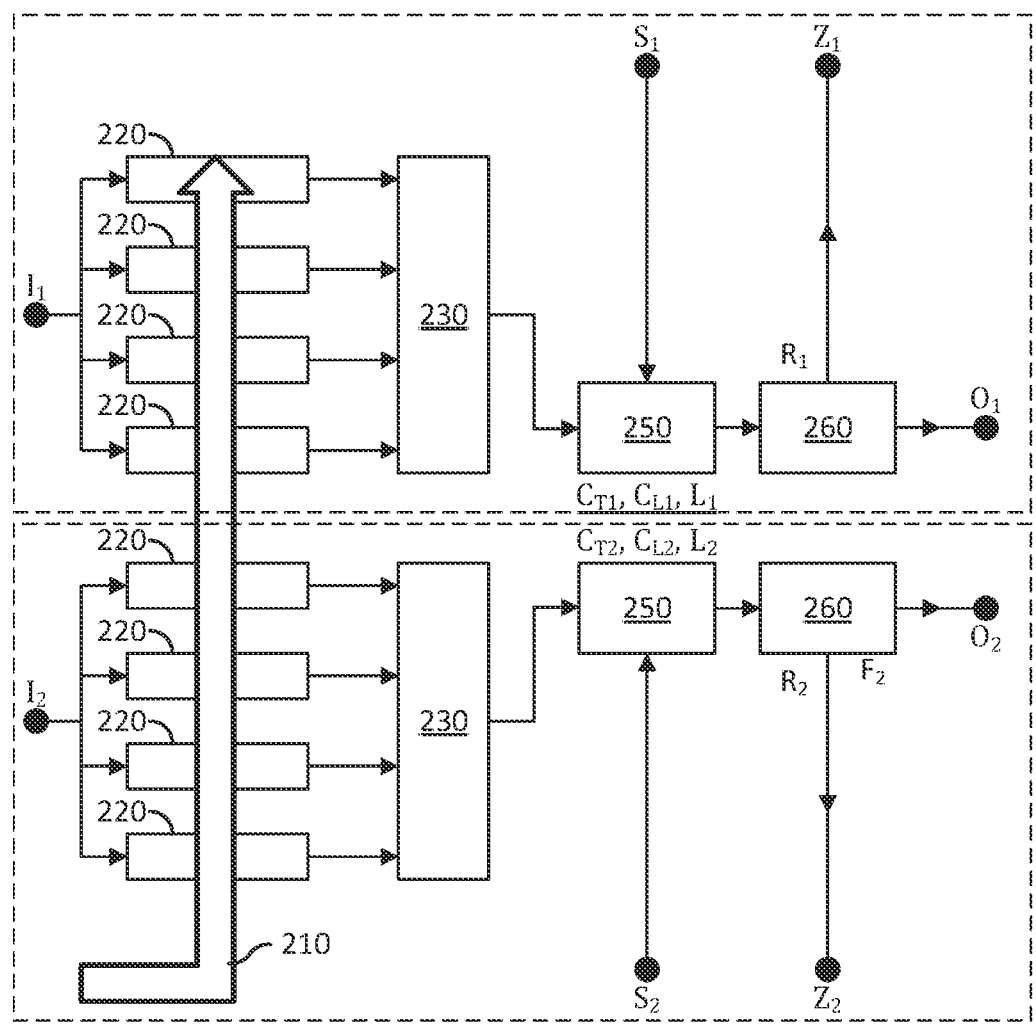
FIG. 6 is a schematic of a dual channel broadband RF power amplifier in accordance with an alternative embodiment of the invention.

The dual channel broadband RF power amplifier 5000, used in the dual-frequency broadband plasma processing system 5555 in FIG. 5, is illustrated in further detail in FIG. 6. As indicated schematically by the two dashed rectangles in FIG. 6, each channel of the eight-port dual channel broadband RF power amplifier 5000 is a four-port single channel broadband RF power amplifier, similar to the single channel broadband RF power amplifier 1000 illustrated in FIG. 2. Thus, the dual channel broadband RF power amplifier 5000 may include two of the single channel RF power amplifier described in prior embodiments such as FIG. 2. Accordingly, the operation of the dual channel broadband RF power amplifier 5000 may be similar except that due to more number of components, separate channels can be processed in parallel to simultaneously produce a dual-frequency output at output ports O1 and O2.

Figure 7:
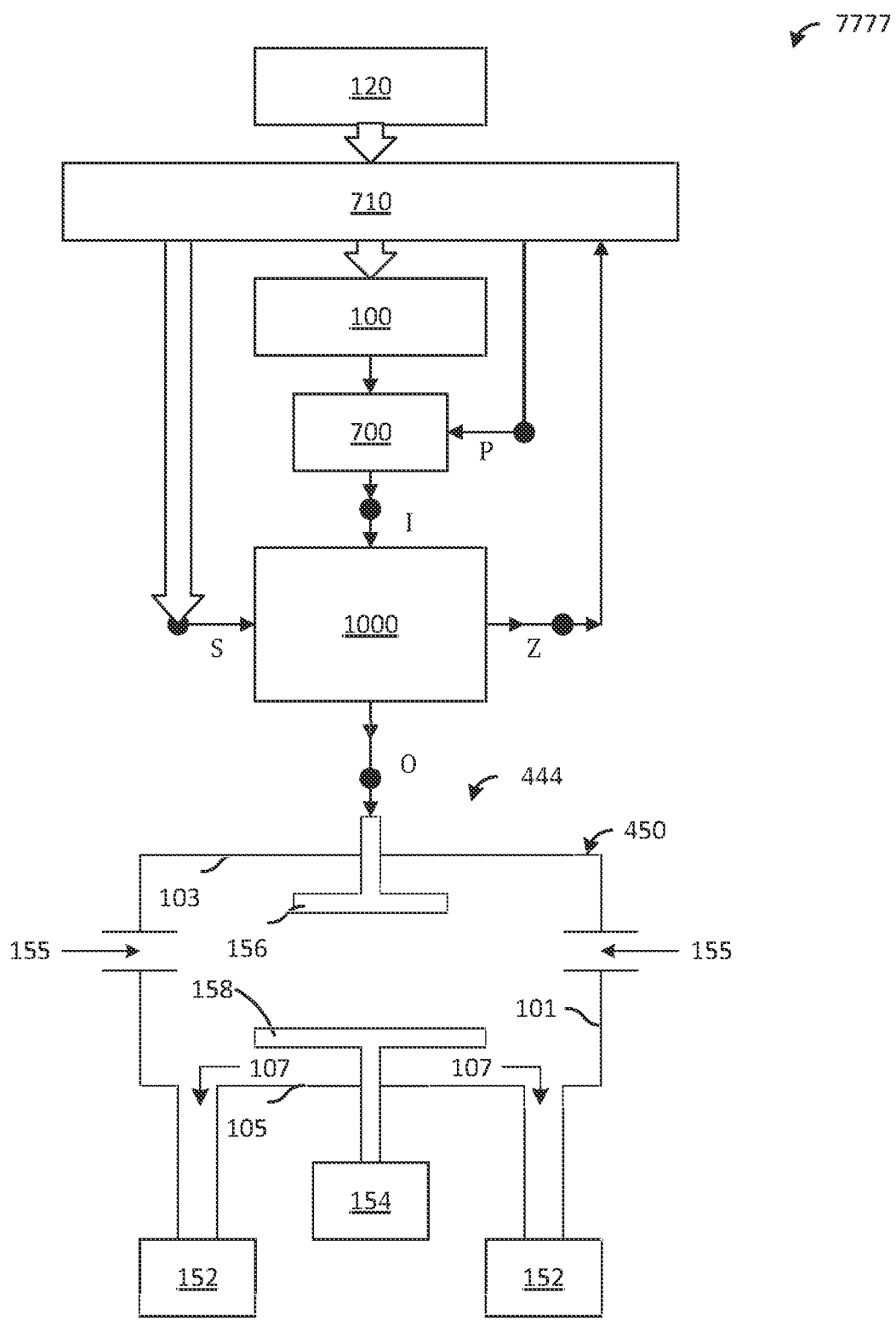
FIG. 7 is a schematic of a broadband plasma system comprising a plasma processing apparatus illustrated in a cross-sectional view in accordance with an embodiment of the invention.
Figure 8:
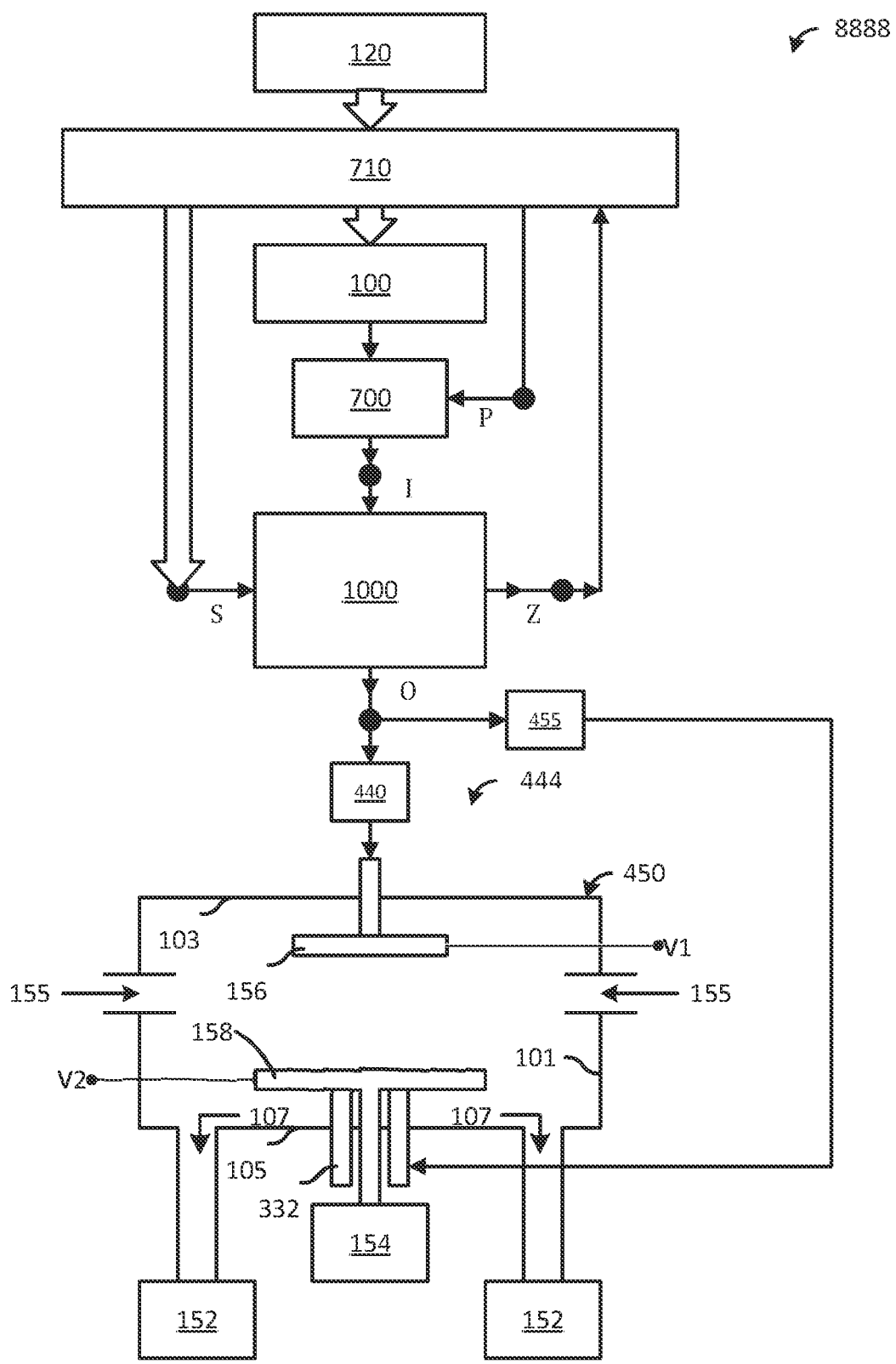
FIG. 8 is a schematic of a broadband plasma system comprising a plasma processing apparatus illustrated in a cross-sectional view in accordance with an alternative embodiment of the invention.

FIGS. 7 and 8 illustrate two examples of broadband plasma processing systems 7777 and 8888 suitable for pulsed sequential or alternating plasma processing. Pulsed plasma processing differs from continuous plasma processing in that RF power to the plasma discharge is chopped into short pulses (e.g., 10 millisecond pulses) using, for example, a programmable chopper circuit comprising electronic switching devices and pulse generator circuitry. The plasma processing system is otherwise the same as the respective system used for continuous plasma processing.

As illustrated in FIGS. 7 and 8, the broadband plasma processing systems 7777 and 8888 have a chopper circuit 700 inserted in the signal path connecting the output of the tunable RF signal generator 100 to the input port I of the broadband RF power amplifier 1000 of the broadband plasma processing systems 1111 and 4444, respectively. The chopper circuit 700 may be controlled by a programmable controller 710.

Except for the chopper circuit 700 and the control path from the programmable controller 710, the schematic view of broadband plasma processing system 7777 in FIG. 7 is same as that of the broadband plasma processing system 1111 in FIG. 1. Likewise, the schematic view of broadband plasma processing system 8888 in FIG. 8 is same as that of the broadband plasma processing system 4444 in FIG. 4 except for the chopper circuit 700 and the corresponding control path. Although not shown, the chopper circuit 700 may be added similarly to the embodiment described in FIG. 3.

The chopper circuit of the chopper circuit 700 interrupts/modulates the continuous RF signal by periodic opening and closing of electronic switches controlled by a low frequency pulse generator in the chopper circuit 700. The frequencies of the low frequency pulse waveform are of the order of 100 Hz, whereas the frequencies of the RF signal from the tunable RF signal generator 100 are between about 100 kHz to about 10 GHz. The chopper circuit 700 may be triggered and the frequency and duty cycle of the low frequency pulses used to modulate the RF signal from the tunable RF signal generator 100 may be controlled by the programmable controller 710 with a control signal sent to a control terminal P of the chopper circuit 700, as illustrated in FIGS. 7 and 8.

In some pulsed processing applications, the RF signal may be switched off during certain pulses during which no plasma processing is performed. For example, PEALD and PEALE utilize alternating reaction and purge pulses during one reaction cycle. Accordingly, the RF signal generator 100 is toggled on (reaction pulse) and off (purge pulse) by the programmable controller 710. The instantaneous RF power waveform at the output port O of the broadband RF power amplifier 1000 could exhibit transient variations for a brief time after the plasma discharge is initiated at the start of a reaction pulse. The transient may be a result of the impedance mismatch caused by the plasma component of the load impedance changing rapidly with time as the plasma is ignited when RF power is turned on. The ultrafast impedance matching (e.g., a response time of less than 100 microsecond) using the frequency sweep tuning with center frequency offset, as described above for the broadband plasma processing systems 1111 and 3333, provides the advantage of reducing transients in RF power supplied to the plasma processing apparatus 444 during pulsed plasma processing. Precise control of RF power supplied to the plasma during each pulse of a pulsed plasma process step may be achieved by reducing (or even eliminating) the uncontrolled transient variations.

Figure 9:
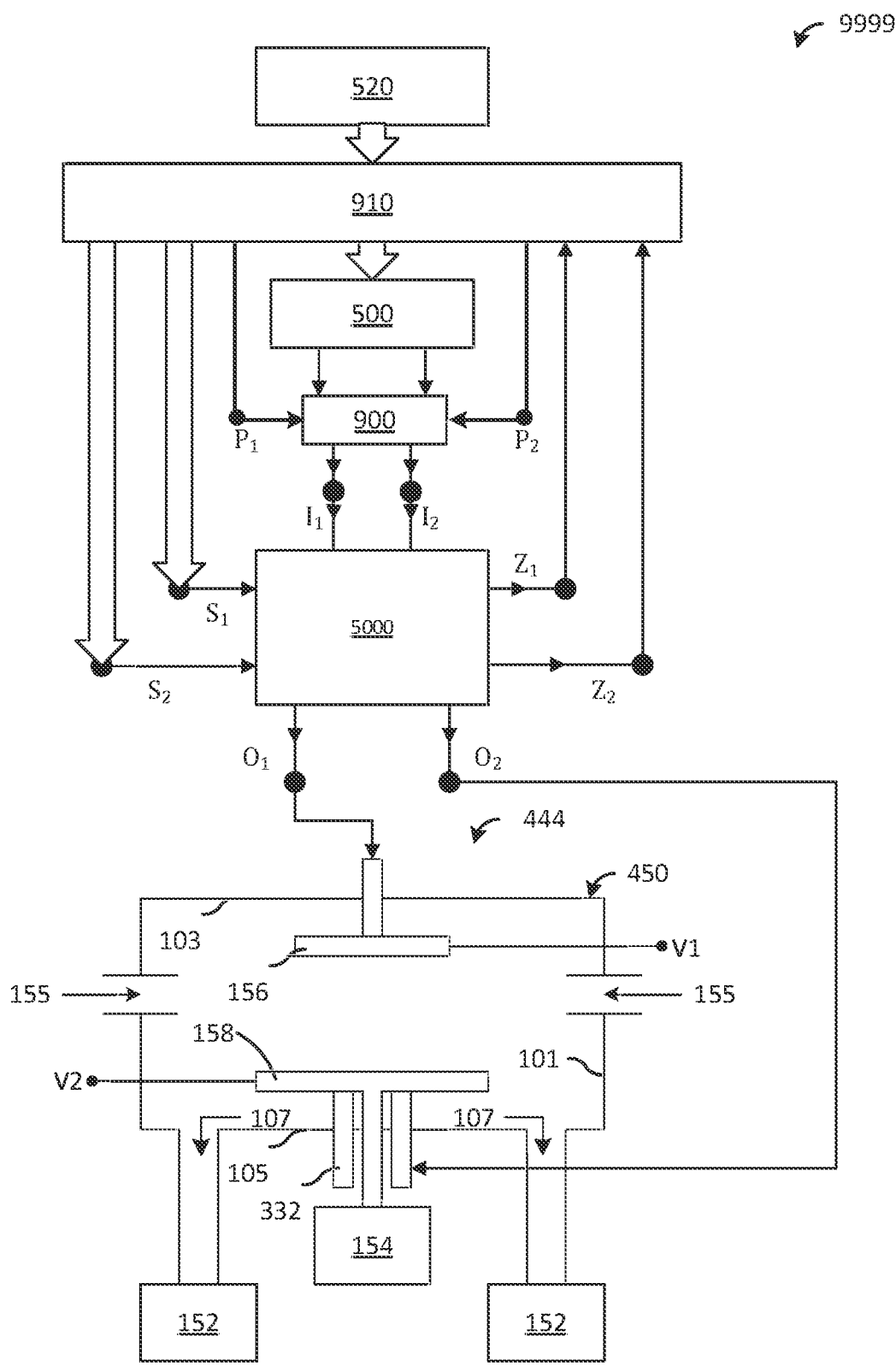
FIG. 9 is a schematic of a broadband plasma system comprising a plasma processing apparatus illustrated in a cross-sectional view in accordance with an alternative embodiment of the invention.

FIG. 9 illustrates an alternative embodiment of a broadband plasma processing systems 9999 suitable for pulsed sequential or alternating plasma processing. This embodiment is similar to the prior embodiments of FIGS. 7-8 to include a chopper circuit that may interrupt/modulate continuous RF signals. However, unlike the embodiment described in FIG. 5, the example embodiment in FIG. 9 may include a dual channel chopper circuit 900 in the signal paths between a tunable dual channel RF signal generator 500 and a dual channel broadband RF power amplifier 5000. The dual channel chopper circuit 900 may include multiple units of the chopper circuit 700 described in prior embodiments and may receive multiple pulse control signals at its control terminals P1 and P2 from the dual channel programmable controller 910 (which operates similar to the previously discussed dual channel programmable controller 510 besides also providing the control signals for the dual channel chopper circuit 900).

Figure 10:
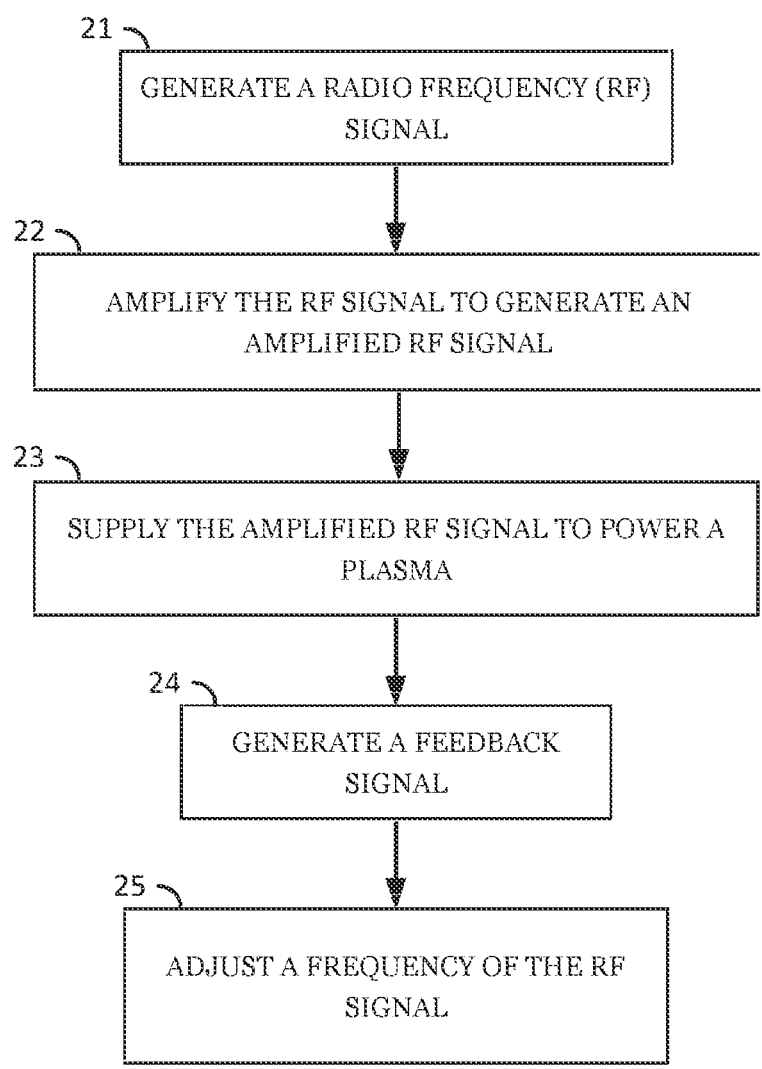
FIG. 10 discloses a method of operating a plasma processing system in accordance with an embodiment of the present invention.

FIG. 10 discloses a method of operating a plasma processing system in accordance with an embodiment of the present invention. The method of FIG. 10 may be applied to any of the systems described in FIGS. 1-9.

Referring to FIG. 10, at a tunable RF signal generator (e.g., tunable RF signal generator 100 of FIG. 1), a radio frequency (RF) signal is generated (box 21).

At a broadband RF power amplifier (e.g., at broadband RF power amplifier 1000 of FIG. 1), the RF signal is amplified to generate an amplified RF signal (box 22). This amplified RF signal is supplied to an RF electrode (e.g., first RF electrode 156 of FIG. 1) to power a plasma within a plasma processing chamber (box 23). A feedback signal is generated at, e.g., the broadband RF power amplifier 1000 that incorporates a measurement of a reflected power at the output of the broadband power amplifier (box 24). The reflected power includes the effect of the impedance of the plasma and is measured using a broadband V-I sensor or a directional coupler. The frequency of the RF signal is adjusted at, e.g., tunable RF signal generator 100, based on the feedback signal.

In an illustrative embodiment (see FIG. 1 as representative system), a deposition process step may be performed first. At the deposition process step, the tunable RF signal generator 100 sends a signal at the first frequency (e.g. a high RF frequency (f1)) at desired amplitude to the broadband RF power amplifier 1000, which amplifies the power and outputs it to the first electrode 156 to ignite a high density first plasma. As soon as the first plasma is ignited, the tunable RF signal generator 100 starts a frequency sweep around the high RF frequency f1 with a certain offset range Δf1 to minimize the reflected power being measured by the power analyzer circuit 260 within the broadband RF power amplifier 1000. The deposition step will begin, and deposition can continue for several reaction cycles (sequential reaction and purge pulses) as in plasma enhanced atomic layer deposition (PEALD).

Next, an exemplary etch process step may be initiated. At the etch step, the tunable RF signal generator 100 switches output frequency and sends a signal at the second frequency (e.g. a low RF frequency f2) at a desired amplitude to the broadband RF power amplifier 1000. For example, in one illustration, the high RF frequency f1 is at least 1.1 times the low RF frequency f2. For example, an embodiment may use a low RF frequency of 27 MHz and a high RF frequency of 40 MHz while another embodiment may use a low RF frequency of 40 MHz and a high RF frequency of 60 MHz. Alternately, in other examples, the high RF frequency f1 is at least two times the low RF frequency f2. The broadband RF power amplifier 1000 amplifies the received signal at the second frequency and outputs it to the first electrode 156 to ignite a second plasma. As soon as the second plasma is ignited, the tunable RF signal generator 100 starts a frequency sweep around the low frequency f2 with a certain offset range Δf2 to minimize the reflected power being measured by the power analyzer circuit 260 within the broadband RF power amplifier 1000. This starts the etching of the material, e.g., a substrate on substrate holder 158 in the plasma processing chamber. Additional method steps especially those particular to a particular hardware design are discussed in more detail above (FIGS. 1-9) while discussing those features and are not repeated herein for brevity.

Accordingly, in various embodiments, the process can quickly toggle between etching and deposition by changing the frequency at the tunable RF signal generator 100 without having to use mechanically driven tuning, as done in conventional equipment.

Accordingly, embodiments of the present application disclose broadband plasma systems and methods for operating a plasma processing apparatus in a sequential, alternating, or pulsed mode.

Accordingly, various embodiments of this invention can achieve fast and smooth transitions of RF power between discrete power levels (e.g., between on and off) or between discrete RF frequencies (e.g., between 10 MHz and 100 MHz), as programmed in a plasma process recipe. In addition, fine tuning of the RF frequency within a narrow band can be achieved by using a programmable controller in a feedback control system. The feedback control system comprises an externally tunable broadband RF signal generator connected to a broadband RF power amplifier fitted with an electronically configurable output matching network, and may be configured by the programmable electronic controller. The fine frequency tuning can be used to rapidly adjust the frequency-dependent impedance of the matching network to match the impedance of the plasma processing apparatus (including the impedance of the plasma) with the output impedance of the broadband RF power amplifier to achieve efficient power transfer. As described in further detail above, the electronic controller dynamically tunes the output frequency of the RF signal generator using feedback of the plasma processing apparatus impedance measured using, for example, an RF voltage-current (V-I) sensor integrated into the output stage of the broadband RF power amplifier.

Example embodiments of the invention are summarized here. Other embodiments can also be understood from the entirety of the specification as well as the claims filed herein.

Example 1

A plasma processing system includes a plasma processing chamber, a first electrode for powering a plasma in the plasma processing chamber, a tunable radio frequency (RF) signal generator configured to output a first signal at a first frequency and a second signal at a second frequency. The second frequency is at least 1.1 times the first frequency. The system further includes a broadband power amplifier coupled to the tunable RF signal generator, the first frequency and the second frequency being within an operating frequency range of the broadband power amplifier. The output of the broadband power amplifier is coupled to the first electrode. The broadband power amplifier is configured to supply, at the output, first power at the first frequency and second power at the second frequency.

Example 2

The plasma processing system of example 1, where the broadband power amplifier is configured to supply simultaneously, at the output, the first power and the second power.

Example 3

The plasma processing system of example 1, where the broadband power amplifier is configured to supply sequentially, at the output, the first power and the second power.

Example 4

The plasma processing system of one of examples 1 to 3, further including: a second electrode disposed in the plasma processing chamber, the second electrode being coupled to the output of the broadband power amplifier.

Example 5

The plasma processing system of one of examples 1 to 4, further including: a first bandpass filter disposed between the output of the broadband power amplifier and the first electrode, the first bandpass filter having a first passband to pass through the first frequency and filter the second frequency; and a second bandpass filter disposed between the output of the broadband power amplifier and the second electrode, the second bandpass filter having a second passband to pass through the second frequency and filter the first frequency.

Example 6

The plasma processing system of one of examples 1 to 5, further including: a chopper circuit disposed between the tunable RF signal generator and the broadband power amplifier, the chopper circuit configured to modulate the first signal and the second signal with a lower frequency pulse signal.

Example 7

The plasma processing system of one of examples 1 to 6, where the chopper circuit includes: a low frequency pulse generator; and electronic switches disposed in a signal path between the tunable RF signal generator and the broadband power amplifier, the electronic switches being controlled by the low frequency pulse generator.

Example 8

The plasma processing system of one of examples 1 to 7, where the output of the broadband power amplifier includes a first output port to output the first power at the first frequency and a second output port to output the second power at the second frequency.

Example 9

The plasma processing system of one of examples 1 to 7, where the output of the broadband power amplifier includes a single output port to output the first power at the first frequency and the second power at the second frequency.

Example 10

A plasma processing system includes a tunable radio frequency (RF) signal generator configured to output a first signal at a first frequency and a second signal at a second frequency. The second frequency is at least 1.1 times the first frequency. The system further includes a broadband power amplifier coupled to the tunable RF signal generator. The first frequency and the second frequency is within an operating frequency range of the broadband power amplifier. The output of the broadband power amplifier is configured to be coupled to an electrode of a plasma processing chamber. The broadband power amplifier is configured to supply, at the output, first power at the first frequency and second power at the second frequency, and provide a feedback to tune the output of the broadband power amplifier to the first frequency or the second frequency.

Example 11

The plasma processing system of example 10, where the broadband power amplifier includes: a plurality of power amplifiers coupled to an input of the broadband power amplifier; a combiner coupled to an output of the plurality of power amplifiers; a directional coupler coupled to an output of the combiner and having an output coupled to the output of the broadband power amplifier; and an impedance power analyzer circuit coupled to the directional coupler or a V-I sensor and configured to provide a feedback signal.

Example 12

The plasma processing system of one of examples 10 or 11, further including: an output matching network circuit coupled between the output of the combiner and the directional coupler or a V-I sensor, the output matching network circuit including electronically configurable network of passive elements.

Example 13

The plasma processing system of one of examples 10 to 12, further including: a programmable controller; a first signal path coupling the programmable controller to the tunable RF signal generator; a second signal path coupling the programmable controller to the output matching network circuit; and a third signal path coupling the impedance power analyzer circuit to the programmable controller.

Example 14

The plasma processing system of one of examples 10 to 13, where the programmable controller is configured to: receive the feedback signal from the impedance power analyzer circuit through the third signal path; provide a first control signal to the tunable RF signal generator through the first signal path; and provide a second control signal to the output matching network circuit.

Example 15

The plasma processing system of one of examples 10 to 14, where the output matching network circuit is configured to reconfigure the output matching network circuit based on the second control signal.

Example 16

A method of operating a plasma processing system comprises generating a radio frequency (RF) signal at tunable RF signal generator; at a broadband power amplifier, amplifying the RF signal to generate an amplified RF signal; supplying the amplified RF signal to power a plasma within a plasma processing chamber; generating a feedback signal by measuring an impedance of the plasma; and adjusting a frequency of the RF signal at the tunable RF signal generator based on the feedback signal.

Example 17

The method of example 16, further including reconfiguring an output matching network circuit based on the feedback signal.

Example 18

The method of one of examples 16 or 17, further including: supplying the amplified RF signal includes supplying the amplified RF signal to a top electrode within the plasma processing chamber.

Example 19

The method of one of examples 16 or 17, further including: supplying the amplified RF signal includes supplying the amplified RF signal to a substrate holder within the plasma processing chamber.

Example 20

The method of one of examples 16 to 19, further including: supplying the amplified RF signal includes supplying the amplified RF signal to a first bandpass filter; outputting the amplified RF signal through the first bandpass filter when the amplified RF signal has a frequency within a first frequency range; coupling the output of the first bandpass filter to a top electrode within the plasma processing chamber; supplying the amplified RF signal includes supplying the amplified RF signal to a second bandpass filter; outputting the amplified RF signal through the second bandpass filter when the amplified RF signal has a frequency within a second frequency range; and coupling the output of the second bandpass filter to a substrate holder within the plasma processing chamber.

Example 21

The method of one of examples 16 to 20, further including modulating the amplified RF signal with a lower frequency pulse signal, where supplying the amplified RF signal to power the plasma includes supplying the modulated amplified RF signal to power the plasma.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A method of operating a plasma processing system, the method comprising:
 generating a radio frequency (RF) signal at tunable RF signal generator;
 at a broadband power amplifier, amplifying the RF signal to generate an amplified RF signal;

supplying the amplified RF signal to power a plasma within a plasma processing chamber;
generating a feedback signal by measuring an impedance of the plasma; and
adjusting a frequency of the RF signal at the tunable RF signal generator based on the feedback signal.

2. The method of claim 1, further comprising reconfiguring an output matching network circuit based on the feedback signal.

3. The method of claim 1, further comprising:
supplying the amplified RF signal comprises supplying the amplified RF signal to a top electrode within the plasma processing chamber or to a substrate holder within the plasma processing chamber.

4. The method of claim 1, further comprising:
supplying the amplified RF signal comprises supplying the amplified RF signal to a first bandpass filter;
outputting the amplified RF signal through the first bandpass filter when the amplified RF signal has a frequency within a first frequency range;
coupling the output of the first bandpass filter to a top electrode within the plasma processing chamber;
supplying the amplified RF signal comprises supplying the amplified RF signal to a second bandpass filter;
outputting the amplified RF signal through the second bandpass filter when the amplified RF signal has a frequency within a second frequency range; and
coupling the output of the second bandpass filter to a substrate holder within the plasma processing chamber.

5. The method of claim 1, further comprising modulating the amplified RF signal with a lower frequency pulse signal, wherein supplying the amplified RF signal to power the plasma comprises supplying the modulated amplified RF signal to power the plasma.

6. The method of claim 1, further comprising modulating, by a chopper circuit, the RF signal with a lower frequency pulse signal, the chopper circuit arranged between the tunable RF signal generator and the broadband power amplifier.

7. The method of claim 1, wherein the RF signal is a first RF signal at a first frequency, the method further comprising generating, at the tunable RF signal generator, a second RF signal at a second frequency, the second frequency being at least 1.1 times the first frequency.

8. A method of operating a plasma processing system, comprising:
generating, by a radio frequency (RF) signal generator, a first signal at a first frequency and a second signal at a second frequency;
amplifying, by an amplifier circuit, the first signal and the second signal, the amplifier circuit having an output coupled to an electrode of a plasma processing chamber;
generating, by a sensor of the amplifier circuit, a feedback signal based on a reflection of the first signal and the second signal at the output of the amplifier circuit;
generating, by a controller, a control signal based on the feedback signal; and
configuring a matching network circuit based on the control signal received from the controller to provide a matching network configuration at the output of the amplifier circuit, the matching network circuit arranged between the RF signal generator and the sensor.

9. The method of claim 8, further comprising modulating, by a chopper circuit, the first signal and the second signal with a lower frequency pulse signal, the chopper circuit arranged between the RF signal generator and the amplifier circuit.

10. The method of claim 9, wherein the chopper circuit comprises:
a low frequency pulse generator; and
electronic switches disposed in a signal path between the RF signal generator and the amplifier circuit, the electronic switches being controlled by the low frequency pulse generator.

11. The method of claim 10, further comprising measuring the reflection of the first signal and the second signal at the output of the amplifier circuit.

12. The method of claim 8, wherein the amplifier circuit comprises a plurality of amplifiers and a combiner, wherein amplifying the first signal and the second signal comprises:
distributing the first signal and the second signal to each of the plurality of amplifiers;
amplifying by each amplifier the first signal and the second signal to generate a respective amplified signal; and
combining, by a combiner of the amplifier circuit, an amplified coupled to an output of the RF signal generator, each amplifier configured to amplify each of the respective amplified signals and generate an amplified first signal and an amplified second signal.

13. The method of claim 12, further comprising simultaneously supplying, at the output of the amplifier circuit, the amplified first signal and the amplified second signal.

14. The method of claim 8, wherein the second frequency is at least 1.1 times the first frequency.

15. A method of operating a plasma processing system, comprising:
outputting, by a tunable radio frequency (RF) signal generator, a first signal at a first frequency and a second signal at a second frequency, the second frequency being at least 1.1 times the first frequency;
supplying, at an output of a broadband power amplifier, first power at the first frequency and second power at the second frequency, the broadband power amplifier coupled to the tunable RF signal generator, the first frequency and the second frequency being within an operating frequency range of the broadband power amplifier, and an output of the broadband power amplifier coupled to an electrode of a plasma processing chamber; and
generating a feedback signal to tune the output of the broadband power amplifier to the first frequency or the second frequency.

16. The method of claim 15, wherein the broadband power amplifier comprises:
a plurality of power amplifiers coupled to an input of the broadband power amplifier;
a combiner coupled to an output of the plurality of power amplifiers;
a directional coupler coupled to an output of the combiner and having an output coupled to the output of the broadband power amplifier; and
an impedance power analyzer circuit coupled to the directional coupler or a V-I sensor.

17. The method of claim 16, further comprising generating, by the impedance power analyzer circuit, a feedback signal based on a reflection of the first signal and the second signal at the output of the output of the broadband power amplifier.

18. The method of claim 17, further comprising generating, by a controller, a control signal based on the feedback signal.

19. The method of claim 18 further comprising reconfiguring electronically configurable network of passive elements of an output matching network circuit based on the control signal, and the output matching network circuit coupled between the output of the combiner and the directional coupler or a V-I sensor.

20. The method of claim 15, further comprising modulating, by a chopper circuit, the first signal and the second signal with a lower frequency pulse signal, the chopper circuit arranged between the tunable RF signal generator and the broadband power amplifier.

\* \* \* \* \*